(12) United States Patent
Ekin

(10) Patent No.: US 10,379,140 B2
(45) Date of Patent: Aug. 13, 2019

(54) CONTACT-DISTANCE TRANSFORMER, ELECTRICAL TESTING DEVICE, AND METHOD FOR PRODUCING A CONTACT-DISTANCE TRANSFORMER

(71) Applicant: FEINMETALL GMBH, Herrenberg (DE)

(72) Inventor: Cetin Ekin, Wildberg (DE)

(73) Assignee: FEINMETALL GMBH, Herrenberg (DE)

( * ) Notice: Subject to any disclaimer, the term of this patent is extended or adjusted under 35 U.S.C. 154(b) by 328 days.

(21) Appl. No.: 15/301,058

(22) PCT Filed: Apr. 2, 2015

(86) PCT No.: PCT/EP2015/057386
§ 371 (c)(1),
(2) Date: Sep. 30, 2016

(87) PCT Pub. No.: WO2015/150548
PCT Pub. Date: Oct. 8, 2015

(65) Prior Publication Data
US 2017/0023615 A1    Jan. 26, 2017

(30) Foreign Application Priority Data

Apr. 4, 2014 (DE) .......... 10 2014 004 942
Apr. 2, 2015 (DE) .......... 10 2015 206 000

(51) Int. Cl.
*G01R 1/073* (2006.01)
*G01R 1/04* (2006.01)
(Continued)

(52) U.S. Cl.
CPC ....... *G01R 1/07371* (2013.01); *G01R 1/0491* (2013.01); *G01R 1/07342* (2013.01);
(Continued)

(58) Field of Classification Search
CPC .... G01R 1/07371; G01R 3/00; G01R 1/0491; G01R 1/07342
(Continued)

(56) References Cited

U.S. PATENT DOCUMENTS 5,772,451 A    6/1998  Dozier, II et al.
6,009,421 A *  12/1999  Xie .......... G06F 11/25
                                          706/61
(Continued)

FOREIGN PATENT DOCUMENTS

CN    103327741 A    9/2013
DE    10050077 A1    5/2001
(Continued)

OTHER PUBLICATIONS

Chinese Office Action in parallel application CN 2015800180276, SIPO, Bejing, dated Mar. 30, 2018, with English translation thereof.
(Continued)

*Primary Examiner* — Giovanni Astacio-Oquendo
(74) *Attorney, Agent, or Firm* — Stephen T. Olson; Harness, Dickey & Pierce, P.L.C.

(57) ABSTRACT

A contact-distance transformer of an electric testing device for testing an electric specimen such as a wafer, for reducing a distance between neighboring electric contacts, the transformer having a non-electrically conductive supporting structure with a first side with first electric contacts positioned apart a first distance and a second side with second electric contacts positioned apart a second, smaller distance. The first contacts are connected to the second contacts by electric connections passing through the support structure and/or which are positioned on the support structure.

25 Claims, 10 Drawing Sheets

Figure 1:
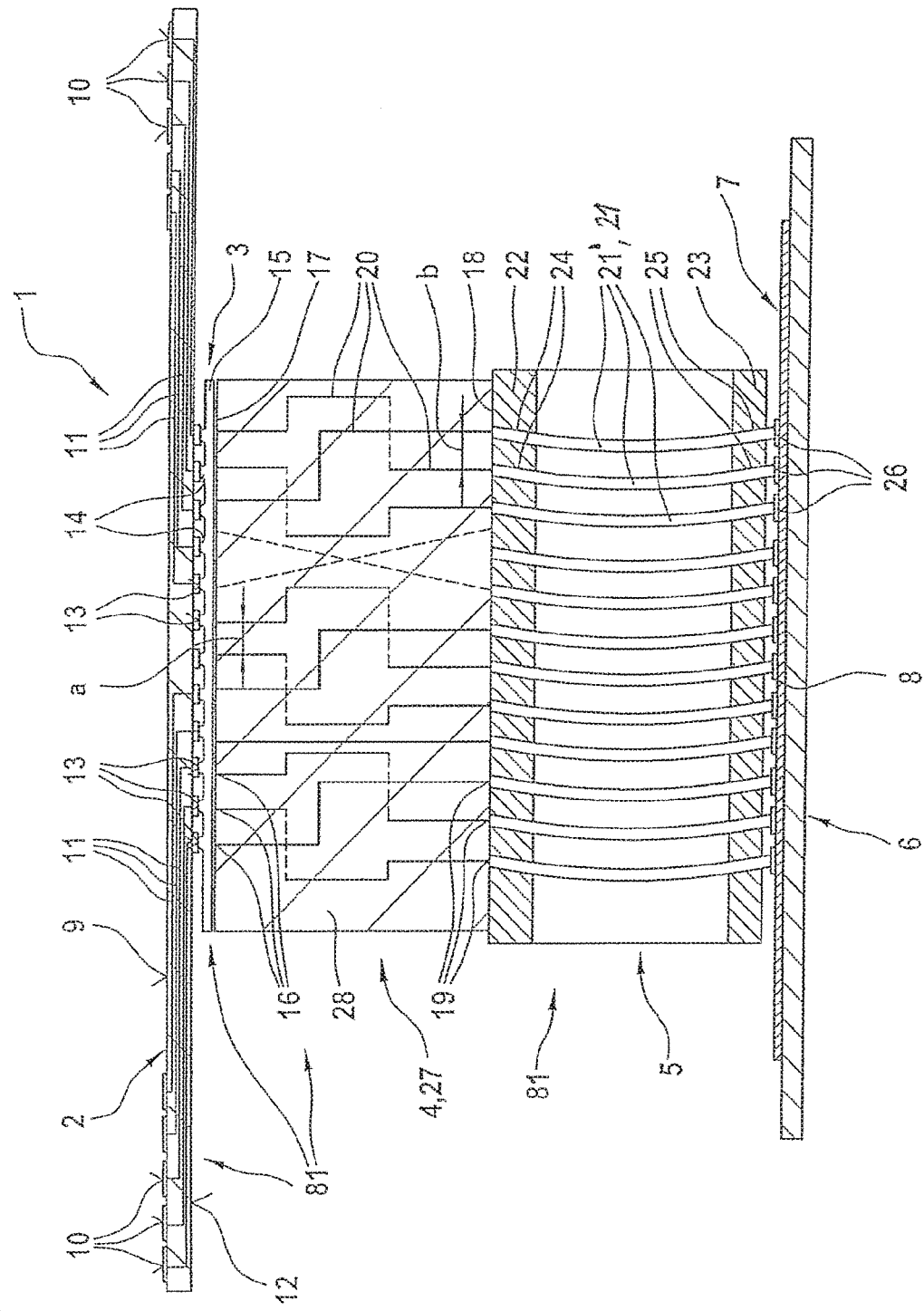

(51) Int. Cl.
*H05K 1/11* (2006.01)
*H05K 3/12* (2006.01)
*H05K 3/46* (2006.01)
*H01R 12/71* (2011.01)
*H01R 12/91* (2011.01)
*H01L 21/67* (2006.01)
*H05K 1/02* (2006.01)
*H05K 3/40* (2006.01)
*G01R 3/00* (2006.01)
*G01R 1/067* (2006.01)
*H05K 1/16* (2006.01)
*G01R 31/28* (2006.01)

(52) U.S. Cl.
CPC ........... *G01R 1/07357* (2013.01); *G01R 3/00* (2013.01); *H01L 21/67288* (2013.01); *H01R 12/714* (2013.01); *H01R 12/91* (2013.01); *H05K 1/0296* (2013.01); *H05K 1/112* (2013.01); *H05K 3/1241* (2013.01); *H05K 3/4038* (2013.01); *H05K 3/4664* (2013.01); *H05K 3/4673* (2013.01); *G01R 1/06761* (2013.01); *G01R 31/2889* (2013.01); *H05K 1/162* (2013.01); *H05K 1/165* (2013.01); *H05K 1/167* (2013.01); *H05K 3/4614* (2013.01); *H05K 2201/0187* (2013.01); *H05K 2201/09236* (2013.01); *H05K 2201/09263* (2013.01); *H05K 2201/1031* (2013.01); *H05K 2201/10189* (2013.01); *H05K 2201/10265* (2013.01); *H05K 2201/10378* (2013.01); *H05K 2203/0126* (2013.01); *H05K 2203/159* (2013.01)

(58) Field of Classification Search
USPC ................ 324/500, 537, 750.16, 750.25
See application file for complete search history.

(56) References Cited

U.S. PATENT DOCUMENTS

| | | | |
|---|---|---|---|
| 6,232,669 B1 | 5/2001 | Khoury et al. | |
| 6,343,669 B2 | 2/2002 | Davis et al. | |
| 6,507,832 B1* | 1/2003 | Evans ................... | G06N 5/025 706/61 |
| 7,071,715 B2 | 7/2006 | Shinde et al. | |
| 7,825,674 B2 | 11/2010 | Shinde et al. | |
| 7,977,957 B2* | 7/2011 | Bohm ................ | G01R 1/06794 324/750.16 |
| 8,098,077 B2* | 1/2012 | Schmid .............. | G01R 1/07357 324/149 |
| 8,217,675 B2* | 7/2012 | Boehm .............. | G01R 1/07378 324/750.16 |
| 9,087,636 B2 | 7/2015 | Kostelnik et al. | |
| 2001/0036718 A1 | 11/2001 | Williams | |
| 2004/0265413 A1 | 12/2004 | Russell et al. | |
| 2005/0156611 A1 | 7/2005 | Shinde et al. | |
| 2006/0244470 A1 | 11/2006 | Shinde et al. | |
| 2008/0061808 A1 | 3/2008 | Mok et al. | |
| 2008/0088327 A1 | 4/2008 | Kister | |
| 2010/0019788 A1 | 1/2010 | Boehm et al. | |
| 2010/0089627 A1 | 4/2010 | Huang et al. | |
| 2010/0282276 A1* | 11/2010 | Kueper ................. | B24B 7/06 134/6 |
| 2012/0056640 A1 | 3/2012 | Rathburn | |
| 2013/0170171 A1 | 7/2013 | Wicker et al. | |
| 2014/0132386 A1 | 5/2014 | Kostelnik et al. | |
| 2015/0002180 A1 | 1/2015 | Endo et al. | |
| 2015/0310982 A1 | 10/2015 | Kostelnik et al. | |

FOREIGN PATENT DOCUMENTS

| | | |
|---|---|---|
| DE | 102008034914 A1 | 1/2010 |
| DE | 202013004524 U1 | 6/2013 |
| DE | 102012220022 A1 | 5/2014 |
| EP | 1716421 A2 | 11/2006 |
| WO | WO 2008102266 A2 | 8/2008 |
| WO | WO 2013108759 A1 | 7/2013 |

OTHER PUBLICATIONS

International Search Report for PCT/EP2015/057386 (German and English), ISA/EP, Rijswijk, NL, dated Jul. 22, 2015.
Written Opinion of the ISA for PCT/EP2015/057386 (German), ISA/EP, Rijswijk, NL, dated Jul. 22, 2015.
International Preliminary Examination Report (Ch. II) dated Mar. 22, 2016, IPEA/EP, Munich (5 pages) in German.
International Peliminary Report on Patentability regarding International Application No. PCT/EP2015/057386. Translation provided by Gleiss & Grosse.
International Search Report for SG/11201608288U (English), from the Intellectual Property Office of Singapore, dated Jan. 15, 2018.
German Office Action in parallel application DE 10 2015 206 000.4, München, dated May 29, 2018.

* cited by examiner

CONTACT-DISTANCE TRANSFORMER, ELECTRICAL TESTING DEVICE, AND METHOD FOR PRODUCING A CONTACT-DISTANCE TRANSFORMER

CROSS-REFERENCE TO RELATED APPLICATIONS

This application is a 371 U.S. National Stage of International Application No. PCT/EP2015/057386, filed Apr. 2, 2015, which claims the benefit of and priority to German Patent Applications Nos. 10 2014 004 942.6, filed Apr. 4, 2014 and 10 2015 206 000.4, filed Apr. 2, 2015. The entire disclosures of the above applications are incorporated herein by reference.

DESCRIPTION

The invention refers to a contact-distance transformer of an electric testing device for testing an electric specimen, in particular a wafer. Moreover, the invention refers to an electric testing device for testing an electric specimen, in particular a wafer, with a contact-distance transformer. Finally, the invention refers to a method for producing a contact-distance transformer of an electric testing device for testing an electric specimen, in particular a wafer.

The contact-distance transformer according to the invention is part of an electric testing device for testing an electric specimen, in particular a wafer. Said electric testing device, which is also part of the invention, preferably is provided with a conductive substrate, in particular a printed circuit board (PCB), which is preferably provided with conductor tracks. The conductor tracks lead, on one side of the conductive substrate, in particular via cables, to a testing device (tester). On the other side of the conductive substrate there are contact surfaces, which are connected to the conductor tracks, and which are electrically connected, through a connecting component (interposer), to said contact-distance transformer. This connection is achieved by physical contact. The contact-distance transformer converts the contact distances of the conductive substrate to a much smaller value, i.e., the contact-distance transformer provides contacts with a very small distance, preferably with a distance corresponding to the contact distance of the specimen. Through a contact head, which is preferably provided with at least two guiding plates, which are distanced from each other and are provided with guiding holes, wherein in the guiding holes bending contact needles are supported, the closely arranged contacts of the contact-distance transformer are connected to the specimen by physical contacting. By means of the testing device it is therefore possible to connect current paths for testing the electric functionality of the specimen. Aside from above said structure of an electric testing device, the invention also comprises other constructions, which are later described in detail. Said individual construction elements, such as the conductive substrate, the connection components, the contact-distance transformer, the contact head and so on are of conventional construction in known testing devices.

The object of the invention is to provide at least a component of a testing device, in particular a contact-distance transformer, which is provided with a simple structure and is inexpensive, and which, in particular, is also produced in a very short time. With respect to a known contact-distance transformer, which is manufactured with multilayer ceramics, wherein the ceramics are provided with ceramic plates provided with conductor tracks and such ceramic plates are piled one above the other, layer by layer, and then compressed and sintered, the goal is to create a component which is essentially easier and less expensive to build. Moreover, a correspondingly simpler and inexpensive construction of the electric testing device has to be achieved as well as a method for obtaining such contact-distance transformers (space transformers) and testing devices.

This object is achieved by a contact-distance transformer of an electric testing device for testing an electric specimen, in particular wafers, due to the fact that the contact-distance transformer, in order to reduce the distance between neighboring electric contacts, is provided with an electric non-conductive supporting structure, which is provided with a first and a second side, wherein on the first side first electric contacts having a contact distance and on the second side second electric contacts are arranged, which have a distance from one another that is smaller than the first contacts of the first side, wherein the first contacts are connected to the second contacts via the electric connections, which pass through the supporting structure and/or are arranged on the supporting structure, wherein both the supporting structure and the electric connections are provided as 3D-printed components. As a consequence, the supporting structure and the electric connections are produced by a 3D-printer-joining method. Since the supporting structure is electrically non-conductive, electric insulating printing material is used for the 3D-printing. For the electric connections, therefore, during the 3D-printing, electrically conductive printing material is used. During the 3D-printing, said printing materials are preferably applied with corresponding dosing heads. As in a 3D-printer, the dosing heads, in which the corresponding joining material (printing material) is placed, move to corresponding positions and at the same time/afterwards the printing material is expelled, so that it constructs—in a solidified form—corresponding parts of the supporting structure or of the electric connections. In particular, the method proceeds in steps, if for instance, on the supporting structure's area an electric connection area has to be applied, the supporting structure's area forms the condition for the following production of the electric connecting area, so that initially this supporting structure area has to be printed, followed by the electric connection area. Preferably, the same and/or different printing materials may be applied one layer at a time. It is obviously possible that in the course of the 3D-printing method, stiffening elements are provided and "printed all around," in order to provide the assembly with a higher resistance. Additionally, adhesives, in particular conductive adhesives and fillers, in particular insulating fillers, may be provided, i.e. printed. According to the invention, therefore, it is possible to provide a contact-distance transformer with a 3D-printing method, which is very inexpensive and leads to a fast availability of the finished product. The most complex structures of the electric connections may be produced in a flat and spatial form on and/or in the supporting structure. The 3D-printing allows the electric connections on the second side of the non-conductive supporting structure, with respect to its arrangement on the first side, to be "bundled" so tightly that the desired reduction of contact-distance is achieved.

According to a development of the invention, the first and/or second contacts are also provided as 3D-printed components. These contacts positioned on the first or second side of the supporting structure may be obtained preferably with the same printing material and dosing head of the electric connections.

According to an embodiment of the invention, at least a first and/or at least a second contact are provided by the front surface of at least one of the electrical connections. The contacts have in this regard the same form of the corresponding electric connections, whereas the respective connections extend up to the first or second side of the supporting structure, so that, viewing from outside, only the front surface of this connection is visible, wherein this front surface forms the corresponding contact.

It is particularly advantageous if the contact-distance transformer is comprised only of 3D-printed components. Therefore it is completely manufactured with a 3D-printing method.

According to an embodiment of the invention it is envisaged that the contact-distance transformer is provided with at least one electric component, in particular a resistor, a coil and/or a capacitor, wherein the component is also comprised of a 3D-printed component. These different components are therefore secondary products of the 3D-printing of the contact-distance transformer. To this end, a dosing head is provided, which contains a printing material, for example, which may be used as a resistance material for an electric resistor. Coils are obtained because of a printing head creating a helical printing track and of the use of electrically conductive printing material. Capacitors may be provided by 3D-printing, in that opposing conductors/electrodes are printed. In this case, between the conductor/electrodes an electric non-conductive printing material may be applied by means of a corresponding dosing head, wherein the printing material preferably has a desired dielectric constant.

It is preferably envisaged that the at least one electric component is connected to at least one of the first contacts, one of the second contacts and/or one of the connections, through an electrically conductive 3D-printed contact spot.

In order to obtain a hybrid construction, preferably a sandwich construction, in the contact-distance transformer, it is preferred that on the first side and/or second side a terminal element, in particular a terminal plate, preferably a ceramic plate, is arranged, in particularly secured, wherein the terminal element is not a 3D-printed component. Two ceramic plates may be preferably provided, between which the 3D-printed area of the contact-distance transformer is arranged, wherein both ceramic plates are provided with through contacts, in particular through vias, which are electrically connected to the first or second contacts. The through contact arrangement of the one ceramic plate has a contact distance corresponding to one of the first contacts and the contact distance of the through contacts, in particular the vias, of the other ceramic plate is selected with a correspondingly smaller value (as for the second contacts), in order to achieve the contact distance conversion (space-transformer-function).

The invention also refers to an electric testing device for testing an electric specimen, in particular wafers, wherein a contact-distance transformer is used, which is provided according to at least one of the preceding embodiments.

According to an embodiment of the electric testing device, it is envisaged that it is provided with a conductive substrate with contact surfaces, which are electrically connected to the first contacts, either directly or through an electric connection component, preferably through a physical contacting electric connection. The connection component is preferably produced according to a conventional technology, hence not with a 3D-printing technique.

The connection component is preferably comprised of a film provided with contact springs. Through the contact springs, on one hand, the contact surfaces of the conductive substrate are physically contacted, and on the other hand, the first contacts of the 3D-printed contact-distance transformer.

According to an embodiment of the electric testing device a contact head is provided, which has contact components for electric physical contact with the specimen. The arrangement is preferably chosen in order that the conductive substrate, in particular as described above, is electrically connected to the contact-distance transformer and that the contact-distance transformer is electrically connected to the one side of the contact head, in particular the contact components of the contact head, wherein the contact head performs an electric physical contacting with contacts of the specimen. This electric physical contact is preferably performed by the contact components of the contact head.

Preferably, in the electric testing device, it is envisaged that the contact components are formed by bending contact needles, spring contact pins, pogo pins or the like. The bending contact needles may elastically flex during contact, i.e. bending outwards and sideways. The spring contact pins may in particular be provided with a spring loaded contact element, for example, a piston slidably supported inside a sleeve, with a contact tip, wherein the piston is pressed by a spring, in particular a coil spring. Also the so-called pogo contact components are elastic contacts, in particular spring loaded contact pins, wherein the term "pogo" is particularly used in the USA.

The electric testing device—according to an embodiment of the inventions—also preferably has a contact head, which is provided with at least two separated guide plates, with guide holes, wherein contact components, in particular bending contact needles for an electric physical contact with the specimen are arranged/supported. The particular bending contact needles may bend sideways during the contact with the specimen, whereby a secure contact is ensured. The contact head is manufactured using a conventional method. The bending contact needles are supported in the guiding holes of the guiding plate in a slidable manner, in order to obtain a good contact on one side with the contact-distance transformer and on the other side with the specimen.

A further embodiment of the invention envisages that the contact components, in particular the bending contact needles, are in physical contact with their one ends with the second contacts of the contact-distance transformer. This has already been previously discussed.

Another embodiment of the invention envisages that the contact-distance transformer also forms the conductive substrate. Therefore, the conductive substrate and the contact-distance transformer are grouped in one component, wherein the whole component is produced by 3D-printing.

It is preferably envisaged that the two contacts of the contact-distance transformer are 3D-printed contact elements, in particular relief printed contact elements for direct physical contact with the specimen. In this embodiment, the testing device does not need a contact head.

It may be also preferably envisaged that the contact elements are provided as point-like contacts, pin-like contacts in the direction of physical contact or preponderantly contact, which are transversely disposed with respect to the direction of physical contact, in particular cantilever contacts. The point-like contacts have a shape which is approximately equal in length as in width. The pin-like contacts directed in the direction of physical contact have a wider extension in the direction of physical contact than in the transverse direction. The contacts which are predominantly transversally arranged with respect to their direction of physical contact, in particular the cantilever contacts, are provided in such a way that they are provided with a portion, which extends transversely with respect to the direction of physical contact, wherein transversally means both obliquely as well as at right angles. They preferably also have an area which is angled with respect to this transverse portion, with which the physical contact with the specimen is provided. In particular, the transverse portion causes a spring effect, i.e. an elastic yield during the physical contact.

The invention also refers to a method for producing a contact-distance transformer of an electric testing device for testing an electric specimen, in particular a wafer, wherein the contact-distance transformer is provided in particular according to any of the preceding embodiments, wherein following steps are provided: 3D-printing, in particular layer-by-layer 3D-printing, of a supporting structure made of electric insulating printing material as well as 3D-printing, in particular layer-by-layer 3D-printing, of electric connections passing through the supporting structure and/or arranged on the supporting structure, which are made of electrically conductive printing material.

In particular, a 3D-printing, in particular a layer-by-layer 3D-printing of first and/or second contacts made of electrically conductive printing material, may be performed, wherein the first and/or second contacts are arranged on at least one of the ends of the electric connections. If the first and/or second contacts are not separate from the electric connections, and the electric connections instead form, through their front surfaces or end zones, the first and/or second contacts, these contacts are already formed when the electric connections are produced.

In particular, it may be envisaged to perform a 3D-printing, in particular a layer-by-layer 3D-printing, in order to produce, by means of electrically conductive printing material, over previously 3D-printed, electric insulating printing material, preferably electric transverse connections or similar, also diagonal connections and so on.

Another embodiment of the inventive method provides a 3D-printing, in particular a layer-by-layer 3D-printing, in order to produce, by means of an electrically conductive printing material, at least one electric resistor.

Such resistors are therefore arranged in particular inside the contact-distance transformer, preferably included in the 3D-printed supporting structure. The same applies for the following capacitor or the following coil.

A 3D-printing, in particular a layer-by-layer 3D-printing, of opposed electrodes of electrically conductive printing material is preferably performed for producing a capacitor, wherein a 3D-printing of dielectric material between the electrodes is preferably performed.

Furthermore, a 3D-printing, in particular a layer-by-layer 3D-printing of spirally shaped and/or helical conductors of electrically conductive material, is provided for producing at least one coil.

The inventive method is also characterized by a 3D-printing, in particular a layer-by-layer 3D-printing of liquid insulating liquid, which diffuses by gravity and then hardens for producing electric insulating portions, in particular insulating layers. These are preferably the supporting structure or parts of the supporting structure. Correspondingly it is also possible to print electrically conductive liquids.

It is also possible to provide, by means of 3D-printing, adhesive and/or filler materials during the production of the contact-distance transformer or of the electric testing device, or during the execution of above said method. The adhesive materials may be electrically conductive or non-conductive. The same is true regarding filler materials.

Figure 2A:
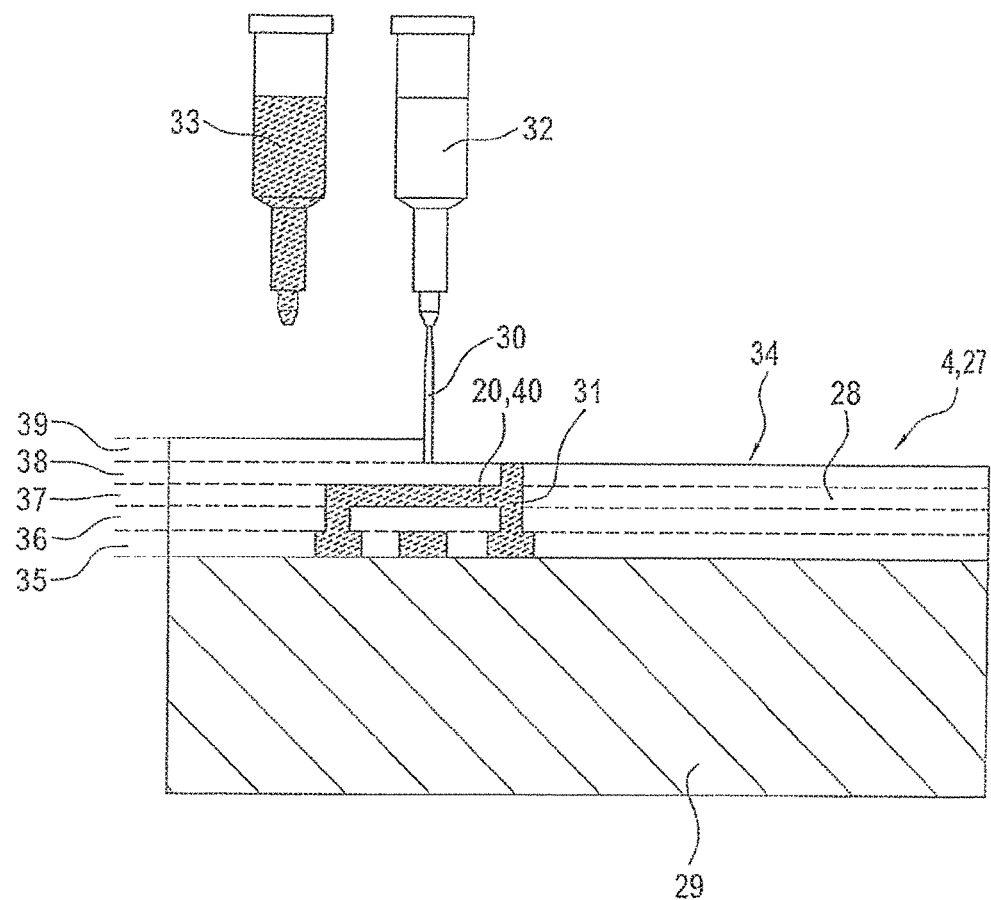
Figure 2B:
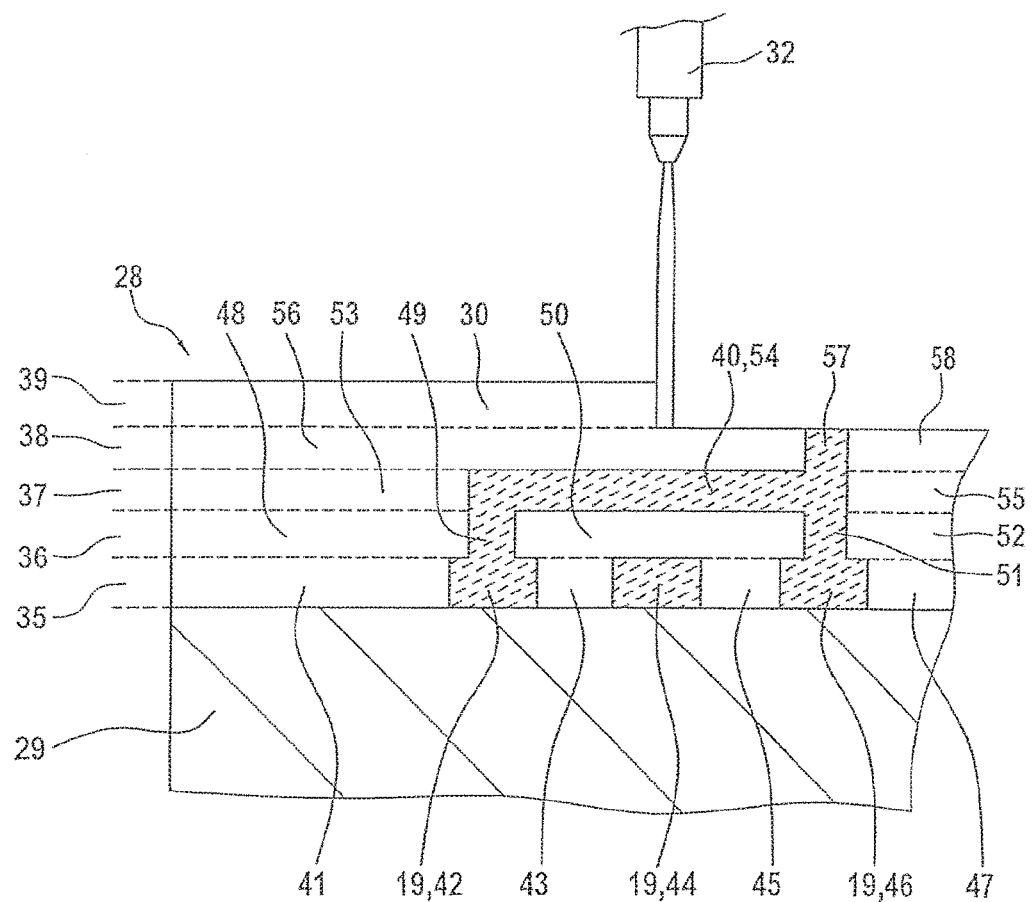
Figure 4:
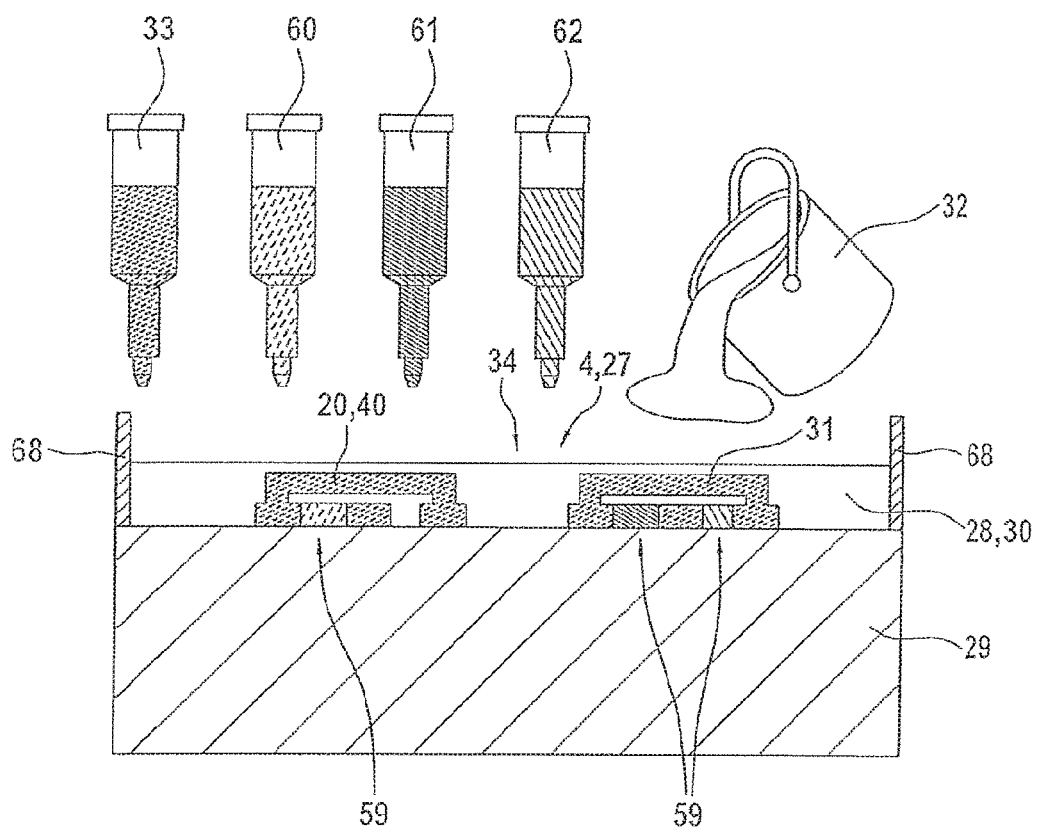
Figure 5:
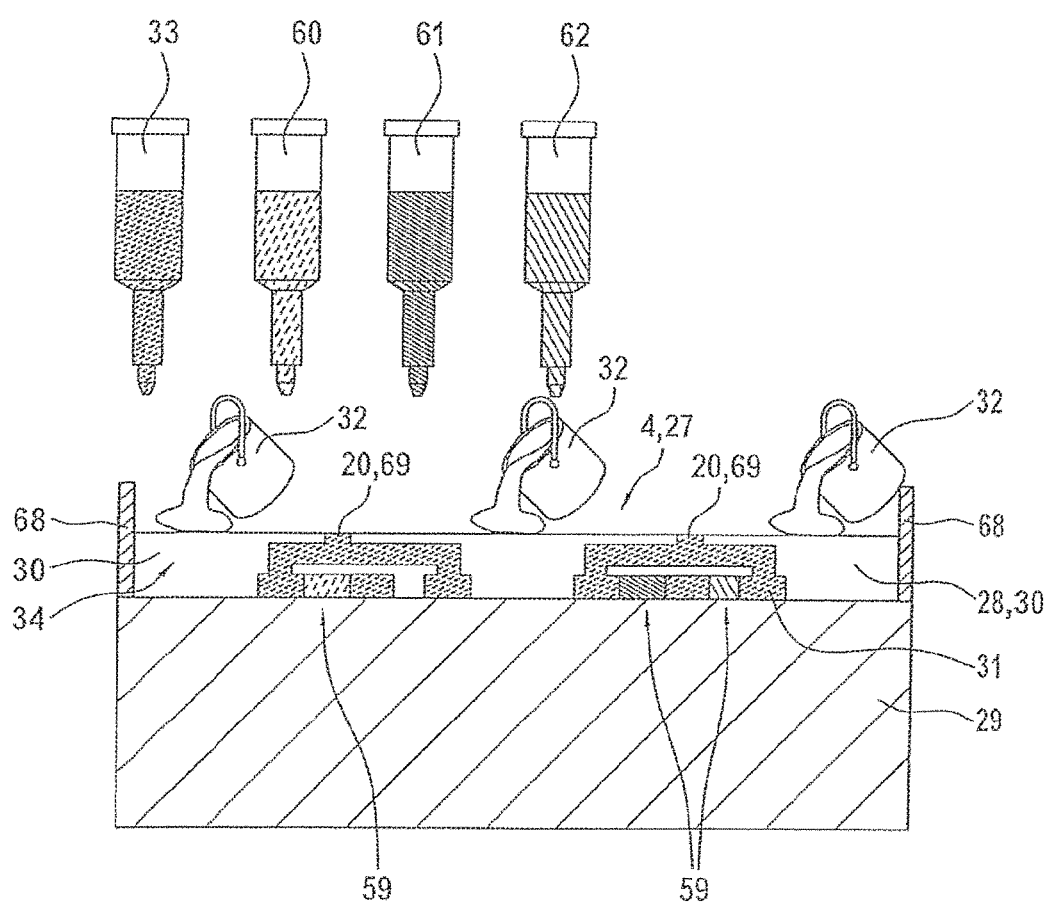
Figure 6:
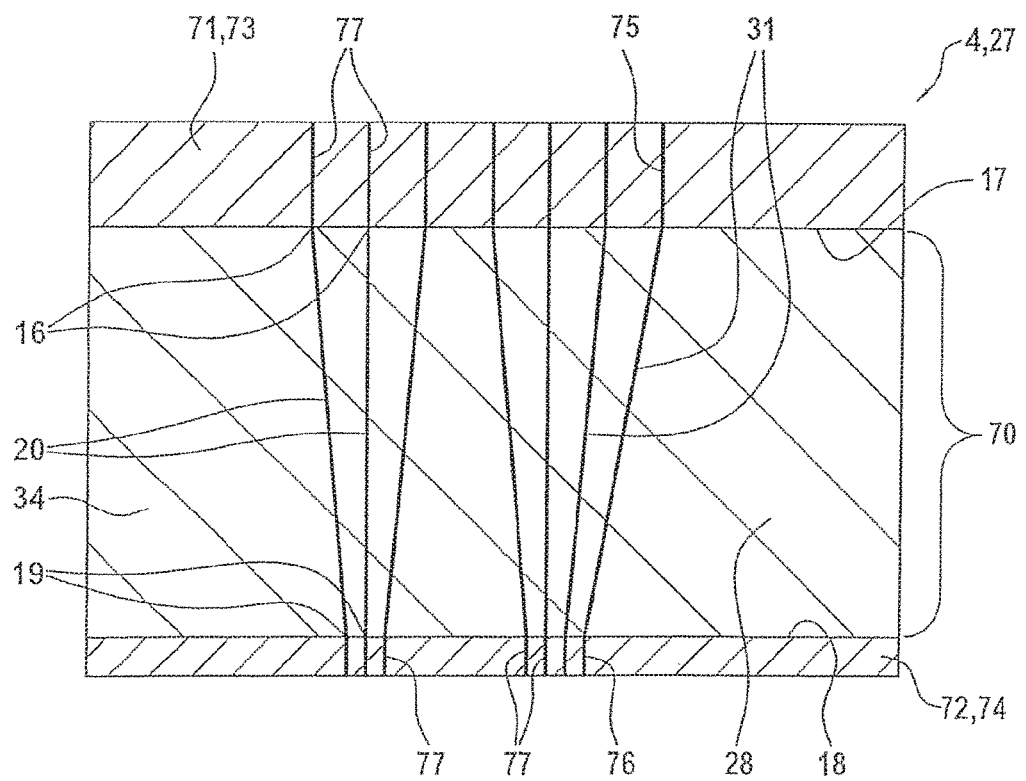
Figure 7:
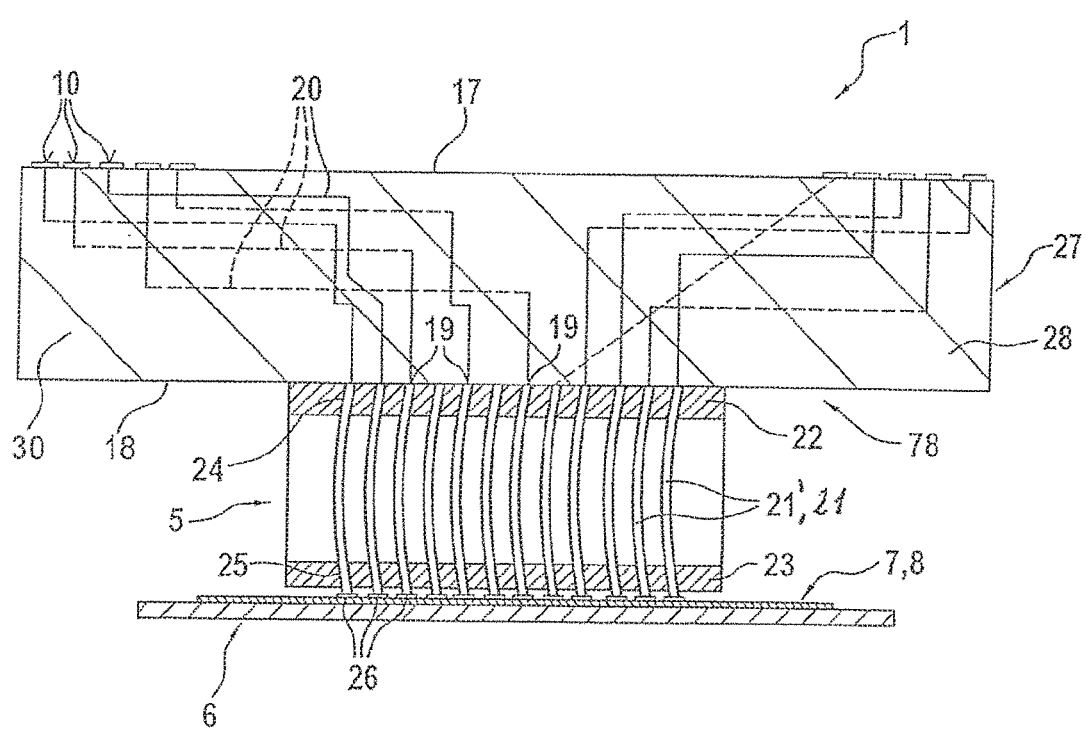
Figure 8:
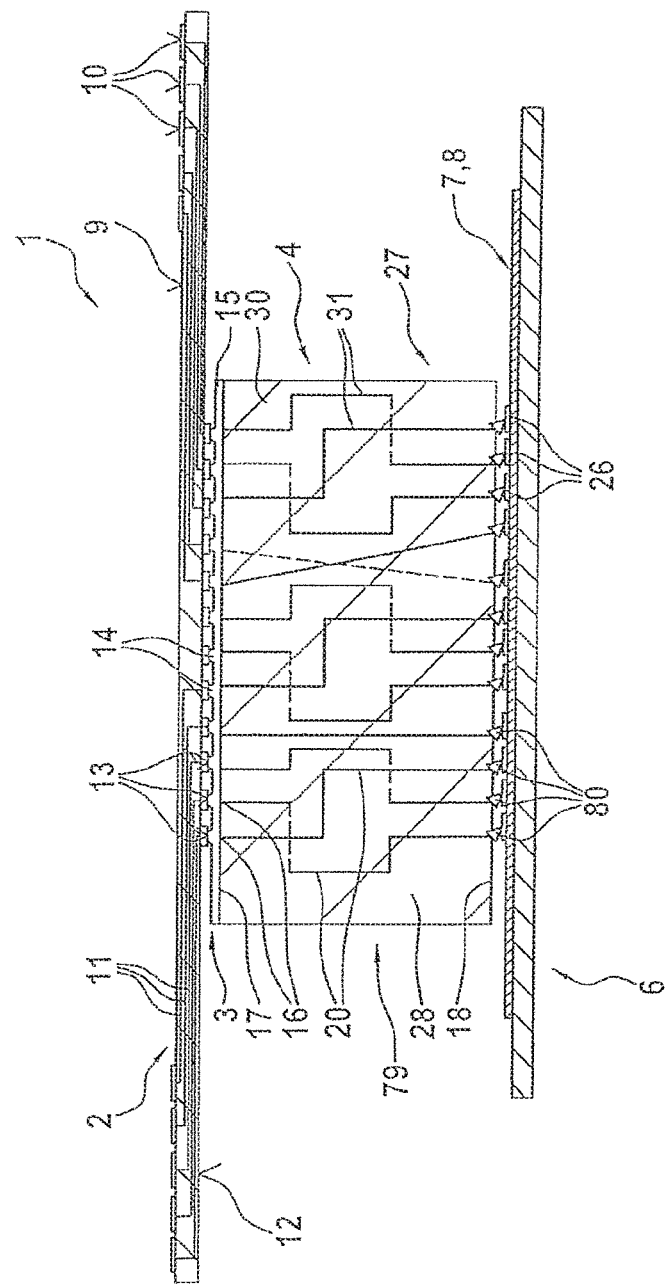
Figure 9:
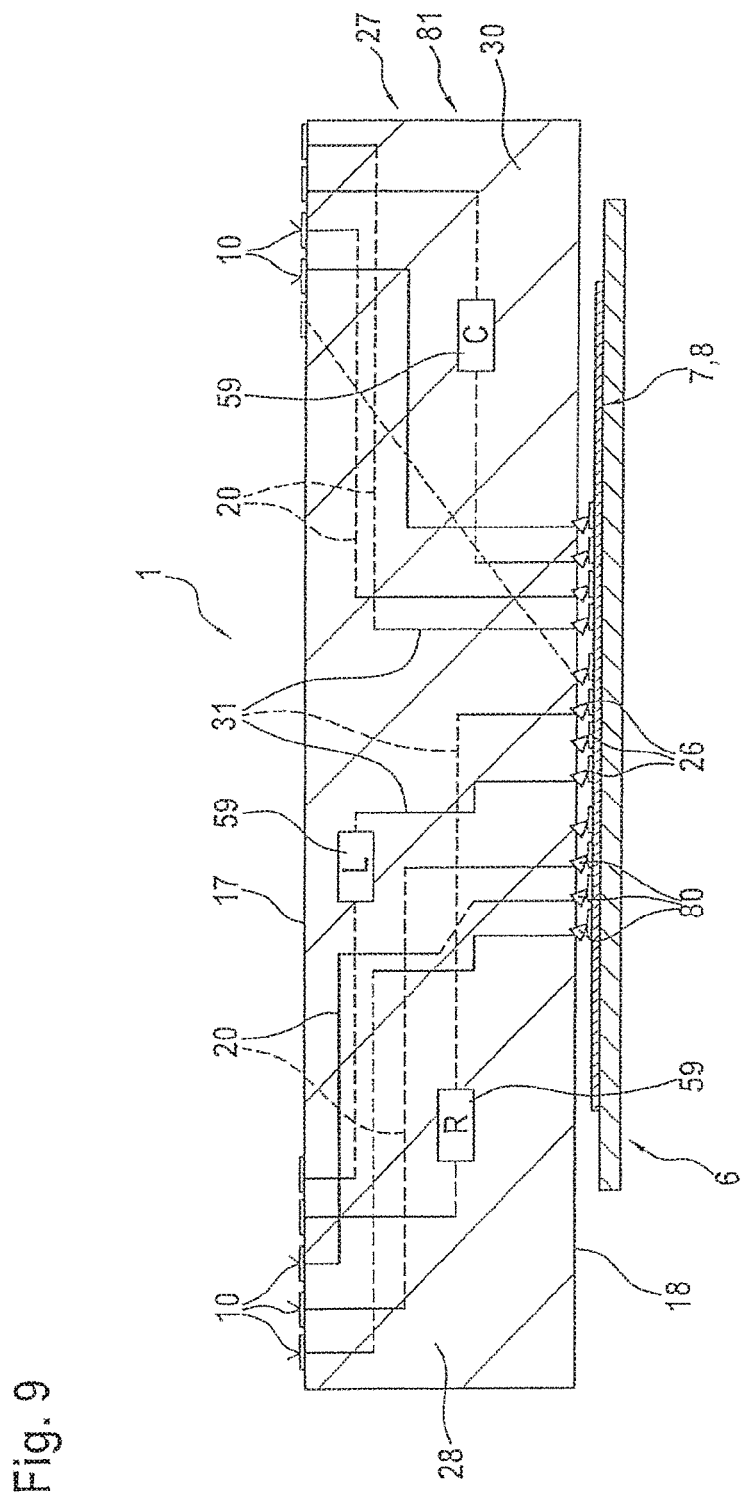

The drawings show the invention by means of exemplary embodiments, wherein in particular:

FIG. 1 shows a schematic representation of a testing device for testing an electric specimen, FIG. 2a shows a 3D-printing process, FIG. 2b shows a particular enlargement of FIG. 2a, FIGS. 3 to 5 show further 3D-printing processes, FIG. 6 shows a schematic cross-sectional view of a contact-distance transformer, FIG. 7 shows a testing device according to a further exemplary embodiment, FIG. 8 shows a testing device according to a further exemplary embodiment, and FIG. 9 shows a testing device according to a last exemplary embodiment.

FIG. 1 shows a testing device 1 in a schematic representation, which comprises a conductive substrate 2, an electric connection component 3, a contact-distance transformer 4 and a contact head 5. The testing device 1 also comprises a receiving table 6 for a specimen 7, whose electric functionality has to be tested, wherein the specimen 7 may in particular be a wafer 8.

The conductive substrate 2, which is in particular a multilayered circuit board, is provided, on its upper side 9, with contact surfaces 10 arranged on its outer edge, which are electrically connected via conductive tracks 11 to contact surfaces 13 disposed on its lower side 12. Contact surfaces 13 are physically in contact with contact springs 14 of the electric connection component 3. The electric connection component 3 is provided with a film 15, which carries contact springs 14. Contact springs 14 physically contact the first contacts 16 of the contact-distance transformer 4. The first contacts are arranged on a first side 17 of the contact-distance transformer 4. On a second side 18 of the contact-distance transformer 4, which preferably is parallel opposed to the first side 17, two contacts 19 of the contact-distance transformer 4 are disposed, wherein the first contacts 16 are connected to the second contacts 19 via electric connections 20. According to the testing of specimen 7, complex path structures of electric connections 20 may be present, in order to connect corresponding first contacts 16 to corresponding second contacts 19. Moreover, it is envisaged that first neighboring contacts 16 have a contact distance a and that second neighboring contacts 19 have a contact distance b.

The arrangement is now made so that the contact distance b is much smaller that the contact distance a, which—due to drawing constrains—cannot be shown in FIG. 1. The second contacts 19 of the contact-distance transformer 4 are physically contacting contact components 21', in particular bending contact needles 21, of the contact head 5. The contact head 5 is provided with two guiding plates 22 and 23, which are distanced and preferably parallel to each other, which are each provided with guiding holes 24 and 25. The bending contact needles 21 are slidably supported in a longitudinal direction in guiding holes 24 and 25, so that they physically contact with their one ends the second contacts 19 and protrude with their other ends from the guiding plate 23, so that they physically contact specimen contacts 26 of specimen 7. The bending contact needles 21—as their name implies—are slightly bent sideways, in order to provide a spring action.

For testing the electric specimen 7, the latter is raised by the receiving table 6 and is pressed against the testing device 1, whereby above said physical contacting of various components takes place. Through electric lines, not shown, which are connected to the contact surfaces 10, and which lead to a testing device, it is now possible to connect test current circuits to the specimen 7, in order to test its functionality. This test preferably takes place also in consideration of a wide temperature spectrum.

The inventive embodiment of FIG. 1 is now provided so that the contact-distance transformer 4 is preferably completely provided as a 3D-printed component 27. It is provided with a non-conductive supporting structure 28, as well as electric connections 20, which pass through the supporting structure 28 and/or which are positioned on the supporting structure 28. These are made of electrically conductive material. The supporting structure 28 and the connections are respective 3D-printed components 27.

FIGS. 2a, 2b, 3, 4 and 5 explain the production process of contact-distance transformer 4, which is manufactured by a 3D-printing method. According to FIG. 2a, on a basis 29 by means of a 3D-printer, not shown in detail, printing material 30 as well as printing material 31 are applied/printed in particular layer by layer, and in particular on respective portions. The printing materials 30 and 31 are preferably provided inside dosing heads 32 and 33 of the 3D-printer. These dosing heads 32 and 33 may be moved to corresponding spatial positions, in order to expel or not the printing material 30, 31. The partial area 34 situated in FIG. 2a on the basis 29 of the developing contact-distance transformer 4 has a total of five layers 35 to 39. The individual layers 35 to 39 are composed of printing material 30 and/or printing material 31. Printing material 30 is electrically non-conductive and provides the supporting structure 28 and printing material 33 is electrically conductive and forms the first contacts 16, the second contacts 19, the electric connections 20 and/or the transverse connections 40. The transverse connections 40 are part of connections 20. Connections 20 extend horizontally, vertically and/or obliquely through the supporting structure 28 along predetermined tracks, (according to the applied software used for printing process of 3D-printer).

In order to clarify the layer-by-layer and, inside each layer, possibly portioned printing of different printing materials 30, 31, reference is made to FIG. 2b, which shows a detail of FIG. 2a in an enlarged scale. By means of the dosing heads 32 and 33, desired positions are reached and the respective printing process is executed. In order to produce the layer 35, initially the area 41 is produced by applying printing material 30. Then, the printing process of dosing head 32 is stopped and printing is resumed with the dosing head 33, in order to create the area 42 of printing material 31. In layer 35, an area 43 of printing material 30 follows, i.e. the printing process is continued with the dosing head 32. It follows an area 44 of printing material 31 and then an area 45 of printing material 30. It follows an area 46 of printing material 31 and then an area 47 of printing material 30 and so on. In the end, in this way, electric non-conductive and electrically conductive areas are created, in order to produce corresponding portions of the supporting structure 28 or of the conductive structure for the second contacts 19, for example. Above said sequence of individual printing processes may obviously be different, for example, initially all electrically conductive areas and then all electric non-conductive areas (or vice versa). On layer 35 layer 36 is then printed, which is formed by an area 48 of non-conductive printing material 30, an area 49 of conductive printing material 31, an area 50 of non-conductive printing material 30, an area 51 of conductive printing material 31 and an area 52 of non-conductive printing material 30. The corresponding areas of layer 36 are printed on corresponding areas of layer 35, so that either the electric non-conductive or the electrically conductive portion is widened or a transition is made from the electrically conductive to the electric non-conductive or vice versa. In the present case, area 49 represents an electric connection 20 to area 42. The same applies to area 51 with respect to area 46. Area 44, which is electrically conductive, is covered by the non-conductive area 50. The third layer 37, which is printed over the second layer 36, has an area 53 of electric non-conductive printing material 30, an area 54 of conductive material 31 and an area 55 of non-conductive printing material 30. In FIG. 2b it can be seen that in this way area 49 is in electric contact with area 54 and the latter is in electric contact with area 51. Area 54 forms a connection 20, which is a transverse connection 40, which is electrically insulated by area 50 from area 44. The next layer 38 has an area 56 of non-conductive printing material 30, an area 57 of conductive printing material 31 and an area 58 of non-conductive printing material 30. Area 57 is electrically connected to area 54. The following layer 39, which is still in the working phase, is comprised—as shown—of a non-conductive printing material 30, which is discharged by the dosing head 32. Further layers may follow. Obviously, the previous description of the printing process only represents some examples, from which it is however clear that it is possible to print in three dimensions and create a corresponding supporting structure 28 as well as embed therein corresponding electric profiles, in order to produce, in the end, the contact-distance transformer 4, as shown in FIG. 1, for example. In order to provide the contact-distance function, on one side (first side 17) a great contact distance is created and on the other side (second side 18) a small, preferably very narrow, contact distance is created. The basis 29 of FIG. 2b is only used as a working table, i.e. the printed structure is raised from the basis 29 at the end of the 3D-printing.

Figure 3:
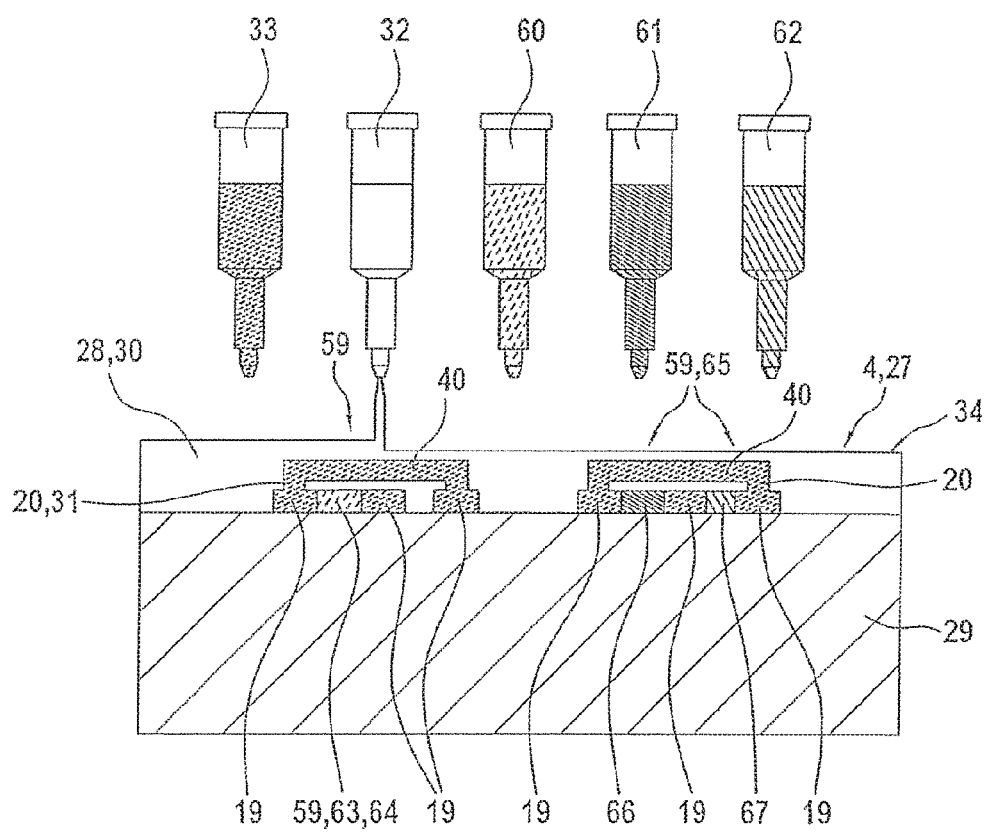

FIG. 3 shows a production process of a contact-distance transformer 4, in which the process is performed according to the description of FIGS. 2a and 2b. Additionally it is envisaged that during the 3D-printing, at least one electric component 59 is also printed. To this end, the 3D-printer is provided, on one hand, with the already described dosing heads 32 and 33, in order to apply non-conductive printing material 30 as well as conductive printing material 31. At least an additional dosing head is however provided. FIG. 3 shows three additional dosing heads 60, 61 and 62. In dosing head 60, printing material of low electric conductivity is provided, i.e. a conductivity for printing electric resistor tracks. Dosing head 61 contains a printing material with a dielectric constant $\in 1$. Dosing head 62 contains a printing material with a dielectric constant $\in 2$. As shown in FIG. 3, a portion of a contact-distance transformer 4 was already finished, which—embedded in non-conductive printing material 30—is provided with two contacts 19 as well as electric connections 20 and transverse connections 40. In the course of the present application, transverse connections 40 represent a subgroup of connections 20. As already said in the introduction, it is also possible to envisage that the second contacts 19 are printed in a way that their spatial dimensions are not different from connections 20, while connections 20 extend up to the outer side of the contact-distance transformer 4, so that their front surfaces are available for physical contact. The end segments of connections 20 are therefore contacts 19. Obviously, in the figures, the still unfinished printing processes are continued until at the end first contacts 16 are printed, which—as shown—may be made in the same way and are available for physical contact. FIG. 3 shows that electrically less conductive printing material 63 for producing an electric resistor 64 has been placed by the dosing head 60 between two second contacts 19. An electric component 59 formed by said electric resistor 64 is formed. In order to provide capacitors 65 as electric components 59, corresponding printing material 66 and 67 has been printed through dosing heads 61 and 62 between corresponding contacts 19, wherein the printing materials 66 and 67 comprise different dielectric constants, whereby the capacitor's capacitance is influenced. If one prints a spiral or helical conductor structure with the electrically conductive printing material 31, the result is the creation of inductances as electric components 59 (not shown). Obviously, electric components 59 need not be placed on the outside—as shown in FIG. 3—but can instead be embedded into the supporting structure 28.

FIG. 4 shows another exemplary embodiment related to the production of the contact-distance transformer 4 by a method of 3D-printing. This device corresponds to the device of FIG. 3, so that reference is made to the latter. The only difference lies in the fact that by means of a dosing head 32, only schematically shown, a printing material 30 is "printed," which is very thin and which, due to its thinness, is diffused by gravity, so that at least portions of the supporting structure 28 are produced in this way. This thin printing material 30 obviously hardens very quickly after its printing. In order to avoid that the printing material 30 flows away, sealing walls 68 are provided on the sides of the printing structures, which are only necessary until the printing material 30 has hardened. After completing the 3D-printed contact-distance transformer 4, it is removed from the tub-like support structure (basis 29 as well as sealing walls 68).

FIG. 5 shows an embodiment corresponding to FIG. 4, i.e. the printing with thin printing material 30 for creating non-conductive areas. Since—as already explained—the 3D-printing is performed in a layer-by-layer fashion, possible separated areas have to be individually filled with thin printing material 30, in order to overcome confining structures 69, which in the present case are formed by electric connections 20. In this sense, the dosing head 32 is successively applied in three different positions, as indicated in FIG. 5.

In particular, with thin printing material 30 according to FIGS. 4 and 5, it may be envisaged that this material, due to capillary force, "draws itself" over structures, like for example printing walls 68 and confining structures 69, i.e., no plane surface is present, but marginal ridges. In such a case it may be envisaged that these ridges are removed by grinding or similar in an intermediate step of the production.

According to another embodiment of the invention, not shown, it is possible that in the respective printing material, for example, in the non-conductive printing material 30, stiffening structures are embedded, in order to convey a higher rigidity to the finished product. These may be formed by stiffening ribs or grates, etc., for example. These stiffening elements are correspondingly embedded by the 3D-printing. It is naturally also possible to 3D-print the stiffening elements, too.

FIG. 6 shows a contact-distance transformer 4, which is only partially produced by a 3D-printing method, i.e. only the central area indicated with 70. On the first side 17 and on the second side 18 of the central area 70, a terminal element 71 or 72 was attached, in particular by gluing. The terminal element 70 is a ceramic plate 73, which is provided with fitting holes 75, drilled with a machine tool, wherein these fitting holes have a contact distance a. Also the terminal element 72 is a ceramic plate 75, which is provided with laser drilled fitting holes 76, wherein the individual fitting holes 76 have a mutual contact distance b. Fitting holes 75 and 76 are provided with through contacts 77 for creating electric conductors. These are electrically connected to the electric connections 20 of the central area 70, which is completely produced by 3D-printing. This can be performed through thermal bonding during the production process. Thermal bonding means that by correspondingly high temperatures, an activation of the material ensues, in order to electrically contact the respective through contacts 77 to the respective electric connections 20. As an end result, the construction of the contact-distance transformer 4 of FIG. 6 is a sandwich-like construction.

FIGS. 7 to 9 show further embodiments of the invention, in which components of the testing device are produced with a 3D-printing method, wherein the components are not only the contact-distance transformer 4, but may also be other components, as explained in the following examples.

FIG. 7 shows a component 78, produced by 3D-printing, which—with respect to FIG. 1—integrates the conductive substrate 2, the connection component 3 and the contact-distance transformer 4. Therefore, on the first side 17 of the component 78, which is preferably completely 3D-printed, the 3D-printed contact surfaces 10 are arranged, from which electric connections 20 lead to the second side 18, on which the second contacts 19 are disposed, which physically contact the contact head 5. Therefore, the component 69 performs the contact-distance transformation both of conductive substrate 2 and of the contact-distance transformer 4.

The exemplary embodiment of FIG. 8 presents a component 79, which is produced by 3D-printing and which integrates the function of the contact-distance transformer 4 and of the contact head 5, in that—with respect to FIG. 1—the contact-distance transformer 4 is provided on its second side 18 with contact elements 80, which are 3D-printed as raised portions, which physically contact the specimen contacts 26 of specimen 7 during its electric testing. For the rest, structure of example of FIG. 8 corresponds to the structure of example of FIG. 1.

FIG. 9 shows a highly integrated component 81, which is preferably completely produced by 3D-printing, and which integrates the functions of the conductive substrate 2, of the connection component 3, of the contact-distance transformer 4 and of the contact head 5 according to the example of FIG. 1. Therefore, on the first side 17 the 3D-printed contact surfaces 10 and on the second side 18 protruding contact elements 80 are positioned in order to physically and electrically contact the specimen 7 in that position. In the example of FIG. 9, in some connections 20 electric components 59 are integrated by 3D-printing, i.e. electric resistors R, coils L and capacitors C. These 3D-printed components may obviously be integrated also in all examples shown in FIGS. 1 to 9.

All cited FIGS. 1 to 9 can show only two-dimensional structures. In fact, these structures are obviously three-dimensional.

The invention claimed is:

1. A contact-distance transformer of an electric testing device for testing an electric specimen,
   a non-electrically conductive supporting structure provided with a first side and a second side, the first side having first electric contacts positioned at a first contact distance to each other, the second side having second electric contacts positioned at a contact distance to each other which is smaller than the first contact distance, the first electric contacts connected to the second electric contacts by electric connections passing through the support structure and/or positioned on the support structure,
   wherein both the support structure and the electric connections are formed as 3D-printed components, and wherein the contact-distance transformer is used to reduce a distance between neighboring electric contacts.

2. The contact-distance transformer according to claim 1, wherein the first and/or second electric contacts are also formed as 3D-printed components.

3. The contact-distance transformer according to claim 1, wherein at least a first and/or at least a second contact are formed by the front surface of at least one of the electric connections.

4. The contact-distance transformer according to claim 1, wherein the transformer is formed exclusively of 3D-printed components.

5. The contact-distance transformer according to claim 1, wherein the transformer is provided with at least one electric component selected from a group consisting of a resistor, a coil and a capacitor, wherein the electric component is also formed as a 3D-printed component.

6. The contact-distance transformer according to claim 5, wherein the at least one electric component is electrically connected to at least one of the first electric contacts, one of the second electric contacts and/or one of the connections by an electrically conductive 3D-printed contact point.

7. The contact-distance transformer according to claim 1, wherein the first side and/or the second side includes a terminal element, wherein the terminal element is not a 3D-printed component.

8. The contact-distance transformer according to claim 1, wherein the terminal element is provided with through contacts, electrically connected to the first or second contacts.

9. The contact-distance transformer according to claim 1, in combination with an electric testing device for testing an electric specimen.

10. The electric testing device according to claim 9, in combination with a conductive substrate provided with contact surfaces electrically connected, to the first contacts of the contact-distance transformer.

11. The electric testing device according to claim 9, wherein the connection component is a film provided with contact springs.

12. The electric testing device according to claim 9, further comprising a contact head provided with contact components for electric physical contacting of the specimen.

13. The electric testing device according to claim 12, wherein the contact components are provided as bending contact needles, spring contact pins, pogos or the like.

14. The electric testing device according to claim 12, wherein the contact head is provided with at least two mutually distanced guiding plates, the at least two mutually distanced guiding plates provided with guiding holes, wherein in the guiding holes the contact components are positioned for an electric physical contact with the specimen.

15. The electric testing device according to claim 12, wherein the contact components physically contact the two contacts of the contact-distance transformer.

16. The electric testing device according to claim 9, wherein the contact-distance transformer is 3D-printed and contributes to forming a 3D-printed conductive substrate.

17. The electric testing device according to claim 12, wherein the second electric contacts of the contact-distance transformer are 3D-printed contact elements for direct physical contact of the specimen.

18. The electric testing device according to claim 12, wherein the contact elements are formed as point-like contacts, pin-like contacts directed in the direction of physical contact or contacts that predominantly extend transversely with respect to the direction of physical contact.

19. A method for producing the contact-distance transformer of an electric testing device for testing an electric specimen of claim 1, the method comprising:
layer-by-layer 3D-printing of a supporting structure of electric insulating printing material; and
layer-by-layer 3D-printing, of electric connections passing through the supporting structure and/or are positioned on the supporting structure, the electric connectors made of electrically conductive printing material, whereby both the support structure and the electronic connections are formed as 3-D printed components.

20. The method according to claim 19, further comprising layer-by-layer 3D-printing of at least one of the first and second electric contacts of electrically conductive printing material, wherein at least one of the first and second electric contacts are positioned on at least one of the ends of the electric connections.

21. The method according to claim 19, further comprising layer-by-layer 3D-printing of electrically conductive printing material on previously 3D-printed electrically insulating printing material, in particular for producing electric transverse connections.

22. The method according to claim 19, further comprising layer-by-layer 3D-printing, of electrically less conductive printing material for producing at least one electric resistor.

23. The method according to claim 19, further comprising layer-by-layer 3D-printing of mutually opposed electrodes made of electrically conductive printing material for producing a capacitor, wherein a 3D-printing of dielectric material takes place between the electrodes.

24. The method according to claim 19, further comprising layer-by-layer 3D-printing, of conductors made of electrically conductive material, for producing at least one coil, the conductors selected from a group consisting of spiral conductors and helical conductors.

25. The method according to claim 19, further comprising layer-by-layer 3D-printing of liquid insulating liquid, which diffuses by gravity and then hardens, for producing electric insulating areas of the supporting structure.

* * * * *